United States Patent
Zhou et al.

(10) Patent No.: US 9,209,258 B2
(45) Date of Patent: Dec. 8, 2015

(54) DEPOSITING AN ETCH STOP LAYER BEFORE A DUMMY CAP LAYER TO IMPROVE GATE PERFORMANCE

(71) Applicant: GLOBALFOUNDRIES Inc., Grand Cayman (KY)

(72) Inventors: Feng Zhou, Beacon, NY (US); Tien-Ying Luo, Clifton Park, NY (US); Haiting Wang, Clifton Park, NY (US); Padmaja Nagaiah, Guilderland, NY (US); Jean-Baptiste Laloe, Saratoga Springs, NY (US); Isabelle Pauline Ferain, Ballston Spa, NY (US); Yong Meng Lee, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 37 days.

(21) Appl. No.: 14/195,330

(22) Filed: Mar. 3, 2014

(65) Prior Publication Data
US 2015/0249136 A1     Sep. 3, 2015

(51) Int. Cl.
| H01L 21/28 | (2006.01) |
| H01L 29/78 | (2006.01) |
| H01L 29/40 | (2006.01) |
| H01L 29/51 | (2006.01) |
| H01L 21/311 | (2006.01) |

(52) U.S. Cl.
CPC ........ *H01L 29/401* (2013.01); *H01L 21/31111* (2013.01); *H01L 29/51* (2013.01); *H01L 29/518* (2013.01)

(58) Field of Classification Search
CPC ..................................................... H01L 29/401
USPC ................. 438/287, 573, 592; 257/388, 412
See application file for complete search history.

(56) References Cited

U.S. PATENT DOCUMENTS

| 8,420,519 B1 * | 4/2013 | Triyoso et al. | 438/592 |
| 8,557,666 B2 * | 10/2013 | Wei et al. | 438/294 |
| 8,704,280 B2 * | 4/2014 | Xu | 257/260 |

* cited by examiner

*Primary Examiner* — Calvin Lee
(74) *Attorney, Agent, or Firm* — Heslin Rothenberg Farley & Mesit P.C.

(57) ABSTRACT

An improved method for fabricating a semiconductor device is provided. The method includes: depositing a dielectric layer on a substrate; depositing a first cap layer on the dielectric layer; depositing an etch stop layer on the dielectric layer; and depositing a dummy cap layer on the etch stop layer to form a partial gate structure. Also provided is a partially formed semiconductor device. The partially formed semiconductor device includes: a substrate; a dielectric layer on the substrate; a first cap layer on the dielectric layer; an etch stop layer on the dielectric layer; and a dummy cap layer on the etch stop layer forming a partial gate structure.

16 Claims, 10 Drawing Sheets

DEPOSITING AN ETCH STOP LAYER BEFORE A DUMMY CAP LAYER TO IMPROVE GATE PERFORMANCE

FIELD OF THE INVENTION

The present invention relates to semiconductor devices and methods of their manufacturing, and more particularly to improving gate performance by depositing an etch stop layer before depositing a dummy cap layer.

BACKGROUND OF THE INVENTION

Semiconductor device fabrication, such as transistor gate fabrication, typically involves several processing steps of depositing, etching, and removing layers to form the desired stack of gate layers. During each processing step, materials may be, for instance, deposited on, or etched from, a wafer. Because gate and, therefore, transistor performance may be impaired if damage to one layer occurs when another is being etched or removed, it may be desirable to seek to enhance gate performance by modifying the process by which layers are deposited and removed during fabrication.

BRIEF SUMMARY

The shortcomings of the prior art are overcome, and additional advantages are provided, through the provision, in one aspect, of a method for manufacturing a semiconductor device. The method includes: depositing a dielectric layer on a substrate; depositing a first cap layer on the dielectric layer; depositing an etch stop layer on the dielectric layer; and depositing a dummy cap layer on the etch stop layer to form a partial gate structure.

An intermediate semiconductor device is also provided. The partially formed semiconductor device includes: a substrate; a dielectric layer on the substrate; a first cap layer on the dielectric layer; an etch stop layer on the dielectric layer; and a dummy cap layer on the etch stop layer, forming a partial gate structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

The present disclosure provides, in part, a process for fabricating field-effect transistors (FETs) with better reliability, low variability of threshold voltage, low gate leakage, and high breakdown voltage. During conventional fabrication of a FET gate, a layered gate structure having a stack of layers of materials may be provided above selected regions of substrate. In one example, a dielectric layer may be deposited, followed by deposition of a cap layer to protect the dielectric layer. And in subsequent steps, an etch stop layer may be deposited before deposition of a metal gate layer, followed by selective etching or regions of the metal gate layer. An etch stop layer may protect and prevent etching of an underlying layer during etching of an overlying metal gate layer.

Also during conventional FET gate fabrication, a layer may be deposited during one step then removed during a subsequent step. In one example, dummy cap layer may be deposited over a selected region of a gate during fabrication. A dummy cap layer may, in one example, protect the region on which it is deposited and temporarily prevent deposition of an additional layer there during selective deposition of another layer elsewhere. Subsequently, the dummy cap layer may be removed, whereupon another layer may be deposited in place thereof.

Figure 1:
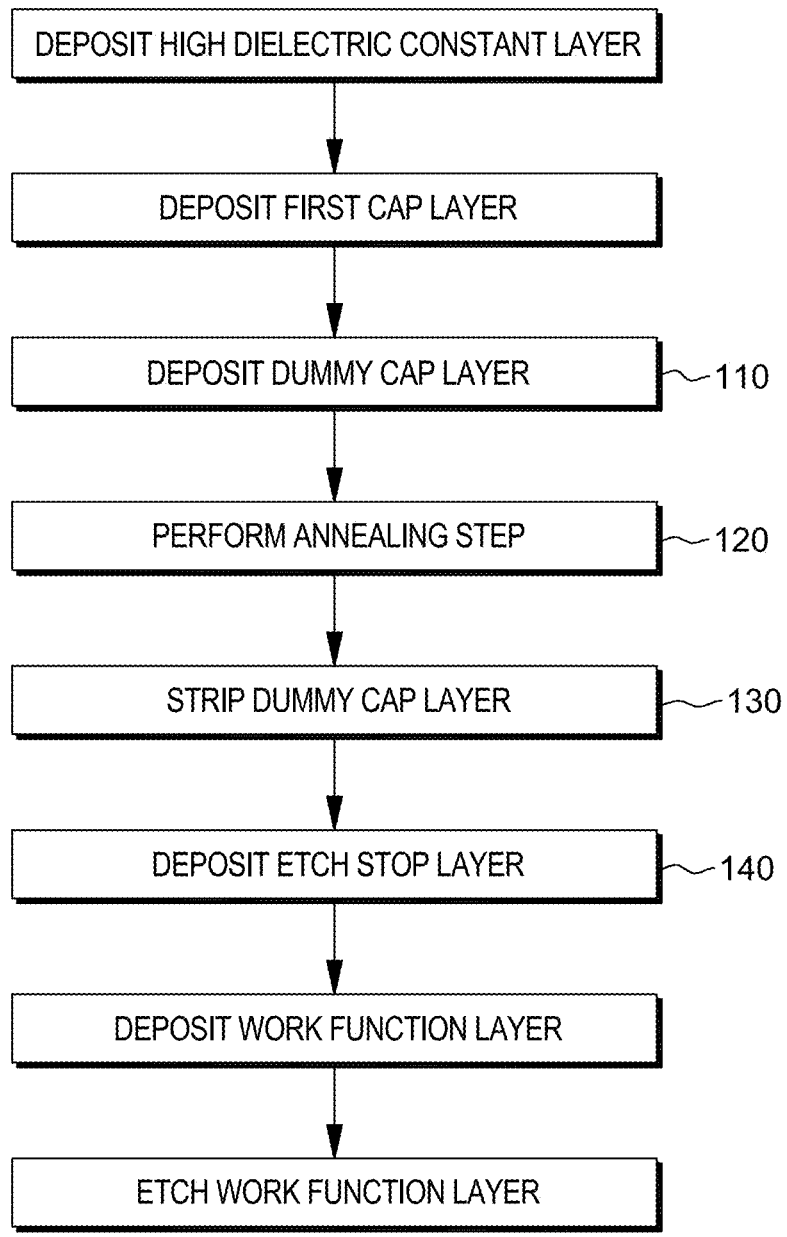
FIG. 1 is a conventional process for fabricating a semiconductor gate structure.

FIG. 1 shows a conventional gate fabrication process. In this example, a dielectric layer is deposited on a substrate, followed by deposition of a first cap layer above the dielectric layer. The dielectric layer may be a material having a high dielectric constant (high-k). A dummy cap layer may then be deposited 110, followed by performance of an annealing step 120. After annealing, the dummy cap layer may be stripped 130, followed by deposition of an etch stop layer 140. A work function layer may then be deposited above the etch stop layer, followed by etching of the work function layer. The deposited etch stop layer serves as an etch stop during etching of the work function layer.

Figure 2:
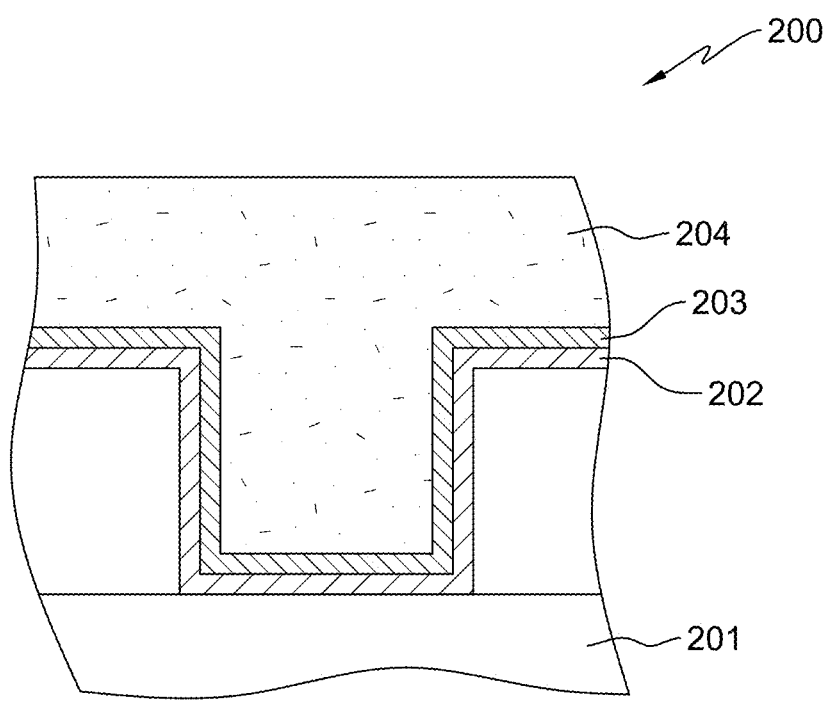
FIG. 2 is a cross-sectional view of a semiconductor gate structure at an intermediate stage of a conventional fabrication process.

FIG. 2 is a cross-sectional view of a gate 200 at a stage of a conventional method of FET fabrication after a dummy cap layer deposition step 110 (FIG. 1), before the dummy cap layer 204 is stripped. As of this stage in the fabrication process, a dielectric layer 202 has been deposited on a substrate 201. Optionally, and in accordance with this example, another layer such as an interfacial layer may be present between the dielectric layer and the substrate (not shown). A first cap layer 203 has been deposited atop the dielectric layer 202, and a dummy cap layer 204 has been deposited directly thereupon. The dummy cap layer 204 is subsequently removed (not shown) during the dummy cap layer stripping step 130 (FIG. 1).

During a conventional FET gate fabrication process, a step of dummy cap layer removal may undesirably impair performance of the resulting FET gate, such as by damaging or otherwise modifying a directly underlying layer. For example, a first cap layer directly underlying a dummy cap layer may be susceptible to modification or damage by a process of dummy cap layer removal. Such modification or damage may include thinning or creating or exacerbating variability of thickness of the cap layer. Undesirable impairment of FET gate performance may include poor reliability, high variability of gate threshold voltage, high leakage, and low breakdown voltage.

Figure 3A:
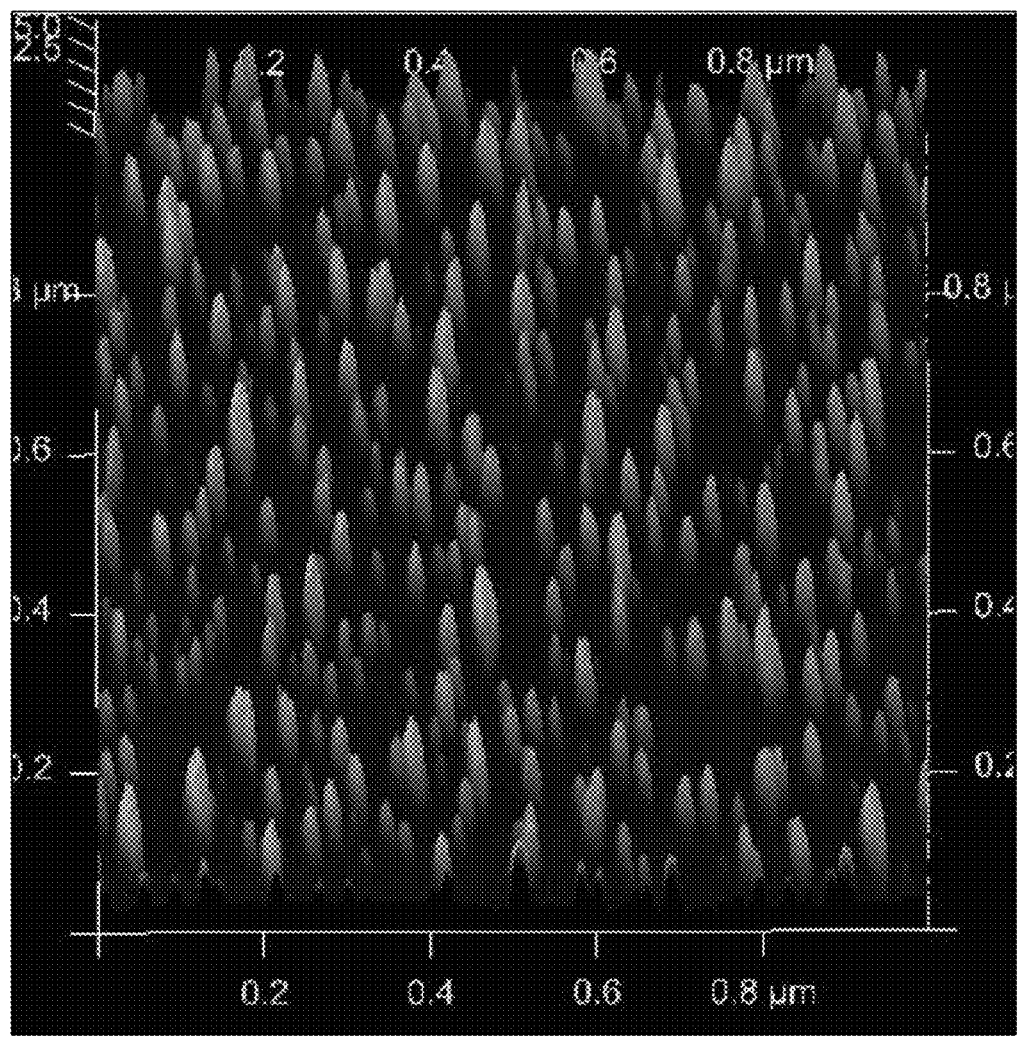
FIGS. 3A-3B are atomic force micrographs of a surface of a semiconductor gate structure at an intermediate stage of a conventional fabrication process.
Figure 3B:
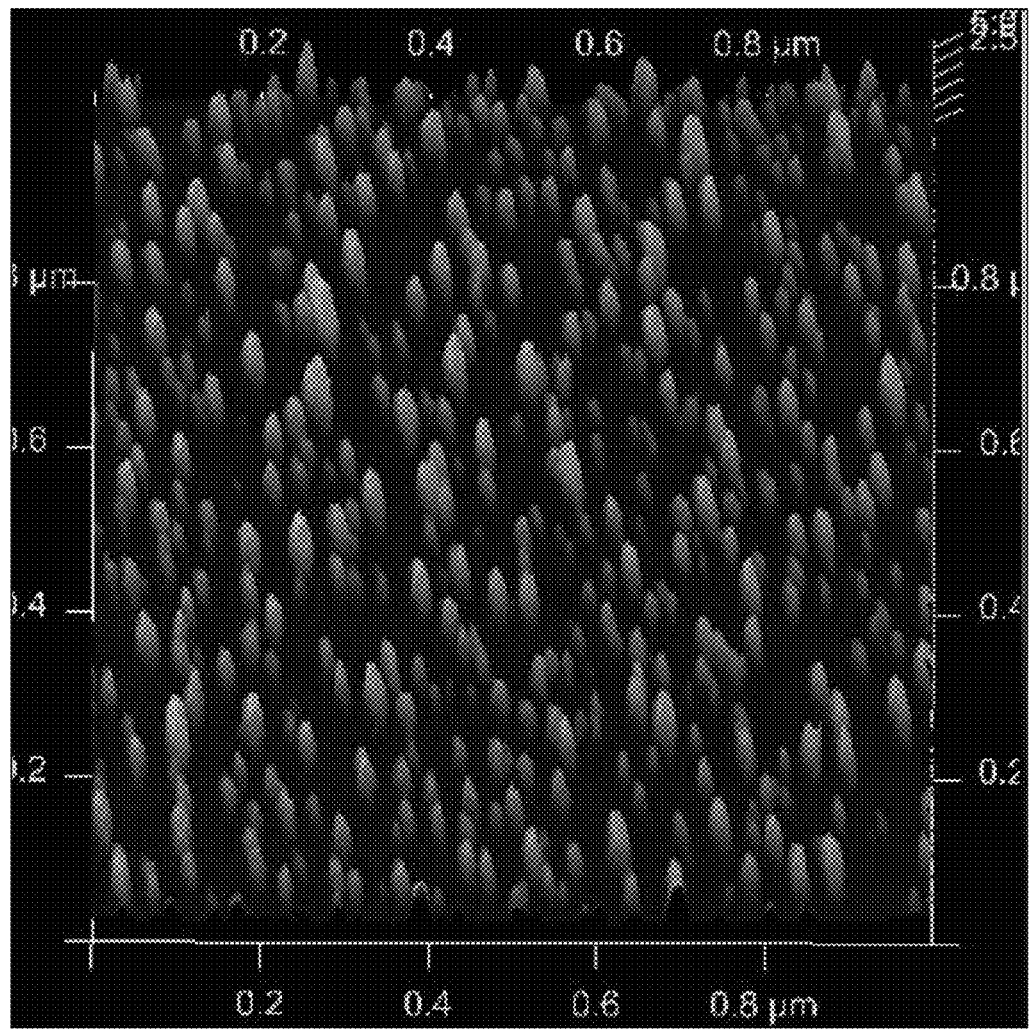

FIGS. 3A-3B are atomic force micrographs of regions of a surface of one example of a first cap layer on a substrate according to conventional fabrication of a FET gate after an annealing 120 and dummy cap layer stripping 130 steps (FIG. 1), before an etch stop layer depositing step 140 (FIG. 1). In this example, an average surface roughness (root mean square) ranged from 1.55 nm near a center of a substrate bearing the first cap layer (FIG. 3A) to 1.50 nm near an edge of the substrate bearing the first cap layer (FIG. 3B), indicating the presence of undesirable variability in layer thickness. These values exceed a surface roughness value of approximately 1.2 nm (not shown) exhibited by a first cap layer 203 before a dummy cap layer 204 is deposited. It is suggested herein that chemical reactions and atomic restructuring at the interface between a first cap layer 203 and a dummy cap layer 204 during an annealing step 120 or damage or modification of a first cap layer 203 during a dummy cap layer stripping step 130 may contribute to the development or exacerbation of variability in layer thickness, with undesirable consequences for FET function and reliability.

In one aspect, the present invention improves transistor performance by altering the order in which layers of a gate are deposited and removed compared to a conventional gate fabrication process. For example, an etch stop layer may be deposited before a dummy cap layer is deposited, to protect an underlying layer during removal of a dummy cap layer.

Figure 4:
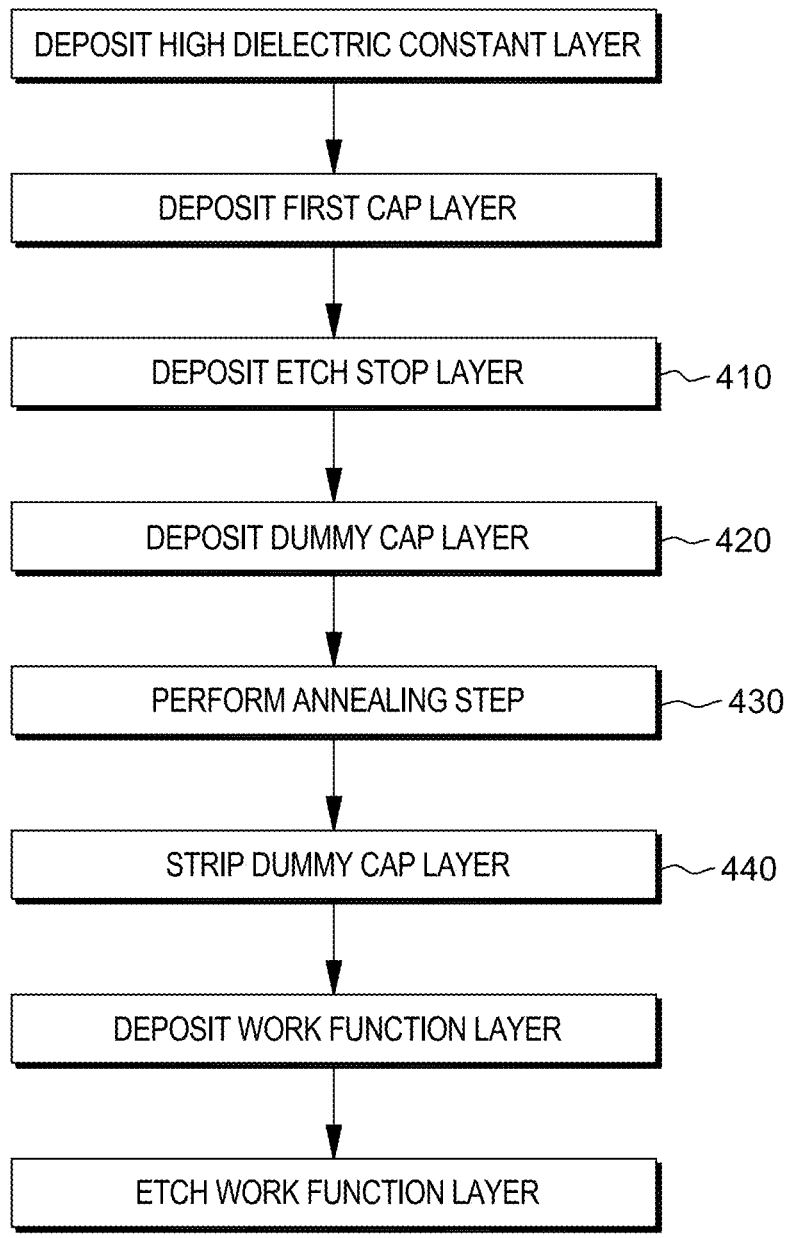
FIG. 4 is one embodiment of a process for fabricating a semiconductor gate structure in accordance with one or more aspects of the present invention.

In the present invention, the order in which different layers are deposited and stripped is altered compared to a conventional process for FET gate fabrication. FIG. 4 shows an embodiment of a gate fabrication process in accordance with an aspect of the present invention. In this example, a dielectric layer is deposited on a substrate, followed by deposition of a first cap layer above the dielectric layer. The dielectric layer may be a material having a high dielectric constant (high-k). After deposition of the first cap layer but before deposition of a dummy cap layer 420, an etch stop layer is deposited 410. A dummy cap layer is then deposited 420 above the etch stop layer, followed by an annealing step 430. After an annealing step 430, the dummy cap layer may be stripped 440, followed by deposition of a work function layer, which may then be etched.

Figure 5:
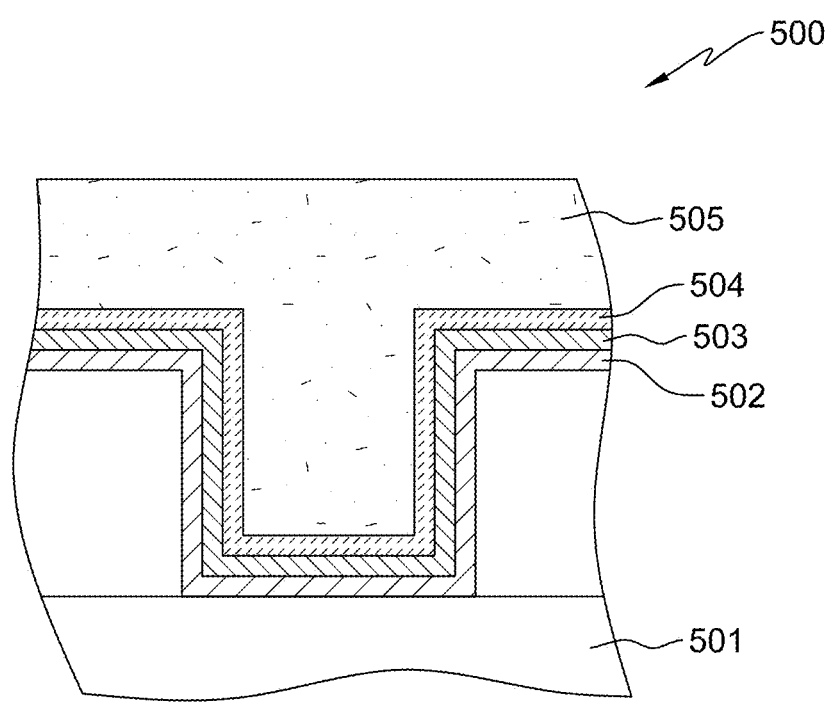
FIG. 5 is a cross-sectional view of one embodiment of a semiconductor gate structure at an intermediate stage of a fabrication process in accordance with one or more aspects of the present invention.

FIG. 5 is a cross-sectional view of a gate 500 at a stage of FET fabrication after a dummy cap layer deposition step 420 (FIG. 4), before the dummy cap layer 505 is stripped, in accordance with the an aspect of present invention. As of this stage of the fabrication process, a dielectric layer 502 has been deposited on a substrate 501. Optionally, and in accordance with this embodiment, another layer such as an interfacial layer (not shown) may be present between the dielectric layer 502 and the substrate 501. A first cap layer 503 has been deposited atop the dielectric layer 502, and an etch stop layer 504 has been deposited atop the first cap layer 503. The dummy cap layer 505 has been deposited directly upon the etch stop layer 504. The dummy cap layer 505 is subsequently removed (not shown) during the dummy cap layer stripping step 440 (FIG. 4). A work function layer may then be deposited and then etched.

Substrate 501 may be (in one example) a bulk semiconductor material such as a bulk silicon wafer. As another example, substrate 501 may be or include any silicon-containing substrate including, but not limited to, single crystal Si, polycrystalline Si, amorphous Si, Si-on-nothing (SON), Si-on-insulator (SOI), or Si-on-replacement insulator (SRI) substrates and the like, and may be n-type or p-type doped as desired for a particular application. In one example, substrate 501 may be, for instance, a wafer or substrate approximately 600-700 micrometers thick, or less.

Fins may extend from substrate 501, and may include one or more fins over which a gate is conformally deposited. By way of example, fins may be formed by removing one or more portions of the substrate to create the fins from the same material as the substrate, such as, for example, a semiconductor or crystalline material. In one example, formation of fins may be achieved by patterning the substrate using any of various approaches, including: direct lithography; sidewall image transfer technique; extreme ultraviolet lithography (EUV); e-beam technique; litho-etch litho-etch; or litho-etch litho-freeze. Following patterning, material removal may be performed, for example, by any suitable etching process, such as an anisotropic dry etching process, for instance, reactive-ion-etching (RIE) in sulfur hexafluoride ($SF_6$). Although the following numbers are relative and the heights could vary, as one specific example, fins may have a height of about 40 nanometers, and a length of about one micrometer, several micrometers, or the diameter of the entire wafer, and the thickness of fins may be approximately 10 nanometers or less. In another example, the fins may be formed on the substrate, and the fins and the substrate may be different materials.

In one example, dielectric layer 502 may be a material including silicon, such as silicon dioxide, or silicon oxynitride. In another example, dielectric layer 502 may be a high-k material having a dielectric constant greater than, for example, approximately 3.9 (the dielectric constant of silicon dioxide), including, but not limited to one or more of hafnium oxide, tantalum oxide, zirconium oxide, titanium oxide, or aluminum oxide. In one specific example, dielectric layer 502 may be a high-k material having a thickness of approximately 15 angstroms (Å). An interfacial layer may facilitate formation of dielectric layer 502, and may be, for example, a chemical oxide of the underlying substrate, such as silicon dioxide, having a thickness of approximately 9 Å.

First cap layer 503 may be included to protect dielectric layer 502 from damage during various processing steps. In one example, cap layer 502 may be or include titanium nitride (TiN), and may have a thickness of approximately between 10 Å and 15 Å, and in one specific example, may be a TiN layer with a thickness of 12 Å.

Each of dielectric layer 502 and first cap layer 503 may be deposited using any of a variety of deposition processes, including, for example, physical vapor deposition (PVD), atomic layer deposition (ALD), chemical vapor deposition (CVD), sputtering, or other processes, depending on the material composition of the layer. The deposition may conform to the substrate structure, including wrapping around fins of structure 501.

Material comprising an etch stop layer 504 may be deposited by a variety of deposition processes, including, for example, physical vapor deposition (PVD), atomic layer deposition (ALD), or chemical vapor deposition (CVD). An etch stop layer 504 may be or include a material that is capable of serving as an etch stop during etching of a work function layer and that can remain deposited on the first cap layer 503 following stripping of the dummy cap layer 505. As one example, an etch stop layer may be or include TaN, and have a thickness between 10 Å and 18 Å.

A dummy cap layer 505 may be or include, as an example, polycrystalline silicon (polysilicon) and may be deposited using conventional deposition processes. Removing dummy cap layer 505 may be achieved by any suitable etching process, such as dry or wet etching processing. In one example, isotropic dry etching may be used by, for example, ion beam etching, plasma etching or isotropic RIE. In another example, isotropic wet etching may also be performed using etching solutions selective to the material of dummy cap layer 505. In some examples, an annealing step 430 may include thermal annealing by exposure to temperatures that may range from 500° C. to 1100° C. for periods of time that may range from several seconds to several hours.

A work-function layer is a conductive layer and may be or include metals and their nitrides that can be etched by a process for which the material comprising the etch stop layer 504 can serve as an etch stop. Some examples of materials a work-function layer may include or be comprised of are titanium aluminum nitride (TiAlN), tantalum aluminum nitride (TaAlN), niobium nitride (NbN), vanadium nitride (VN), tungsten nitride (WN). In another example, a work-function layer may be or include metals and their carbides, such as titanium carbide (TiC), titanium aluminum carbide (TiAlC), titanium aluminide (TiAl) tantalum carbide (TaC), tantalum aluminum carbide (TaAlC), niobium carbide (NbC), vanadium carbide (VC), etc. In another example, a work-function layer may also include ruthenium (Ru), platinum (Pt), molybdenum (Mo), cobalt (Co) and alloys and combinations thereof.

Figure 6A:
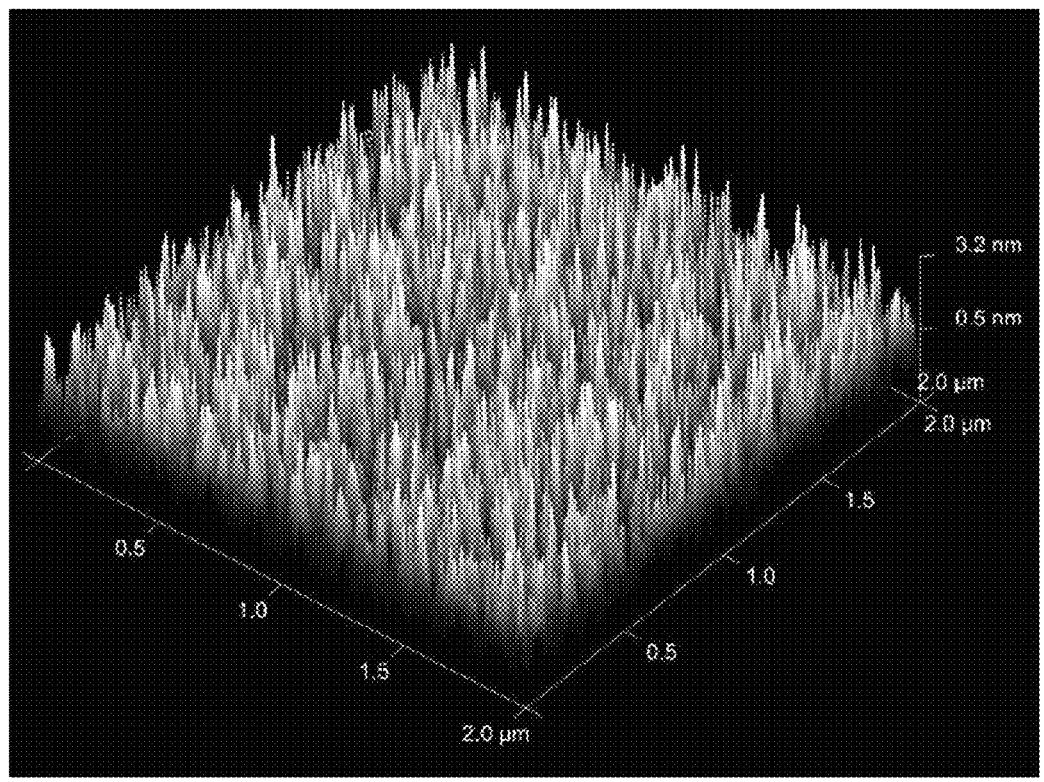
FIGS. 6A-6B are atomic force micrographs of a surface of one embodiment of a semiconductor gate structure at an intermediate stage of a fabrication process in accordance with one or more aspects of the present invention.
Figure 6B:
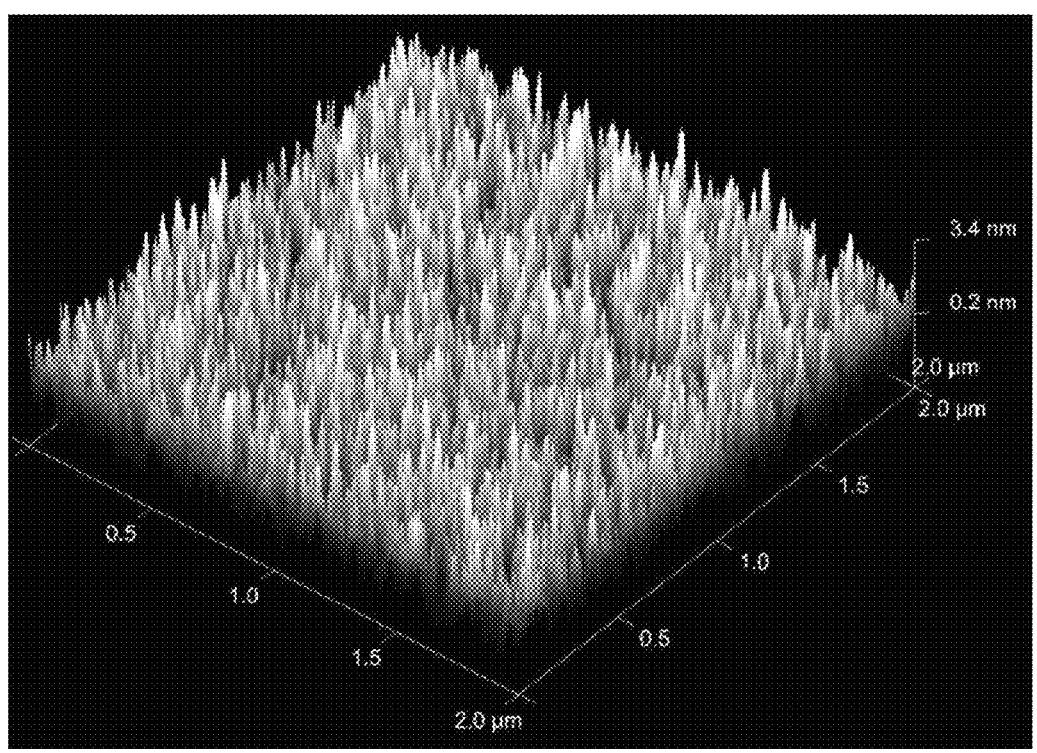

FIGS. 6A-6B are atomic force micrographs of regions of a surface of one embodiment of an etch stop layer during fabrication of a FET gate after an annealing 430 and dummy cap layer stripping 440 steps (FIG. 4), which occurred after the etch stop layer depositing step 410 (FIG. 4) in accordance with an aspect of the present invention. In this example, an average surface roughness (root mean square) ranges from 0.83 nm near a center of a substrate bearing the etch stop layer (FIG. 6A) to 0.98 nm near an edge of the substrate bearing the etch stop layer (FIG. 6B). These roughness values are less than those seen after stripping of a dummy cap layer that is directly underlain by a first cap layer, when no etch stop layer had been deposited therebetween, in accordance with a conventional method of fabricating a FET gate (FIGS. 3A-3B). These low surface roughness values indicate low undesirable variability of layer thickness.

Figure 7:
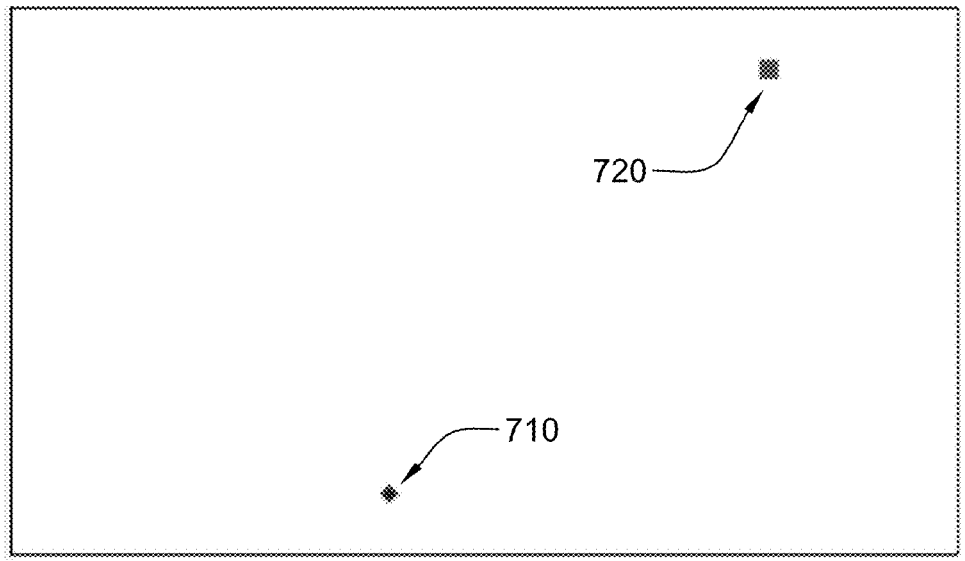
FIG. 7 is a graph of positive bias temperature instability as assessed by a voltage ramp stress test of a FET fabricated by a conventional process and fabricated by a process in accordance with one or more aspects of the present invention.

Long-term reliability of FETs fabricated in accordance with an aspect of the present invention is beneficially increased. FIG. 7 is a graph showing positive bias temperature instability (PBTI), a measure of semiconductor reliability, as assessed by a voltage ramp stress test. The Y axis is improvement in PBTI. In this example, depositing an etch stop layer 504 before depositing a dummy cap layer 505 resulted in a 20% improvement in PBTI. The higher PBTI improvement of the FET manufactured in accordance with an aspect of the present invention 720 indicates that it has better reliability than a FET manufactured in accordance with a conventional fabrication method 710.

Figure 8:
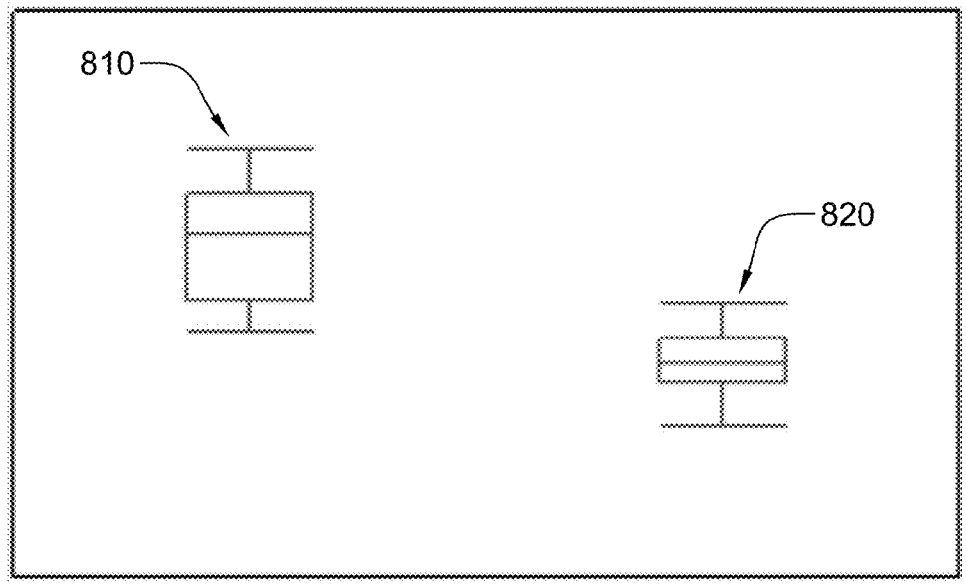
FIG. 8 is a graph of threshold voltages of semiconductor gates fabricated by a conventional process and fabricated by a process in accordance with one or more aspects of the present invention.

Undesirable variability in threshold voltage (Vt) of FETs fabricated in accordance with an aspect of the present invention is beneficially reduced. FIG. 8 is a graph showing variability between Vt measured at multiple N-type FETs (NFETs) in different regions of a given semiconductor wafer that was fabricated in accordance with either a conventional process 810 or an aspect of the present invention 820. The Y-axis is Vt. Error bars represent variability in Vt levels for a given semiconductor wafer. The relatively lower variability in Vt of the NFETs fabricated in accordance with the present invention 820 indicates that depositing an etch stop layer before the sequence of depositing a dummy cap layer, performing an annealing step, and stripping the dummy cap layer reduces undesirable variability of Vt of a resulting NFET.

Figure 9:
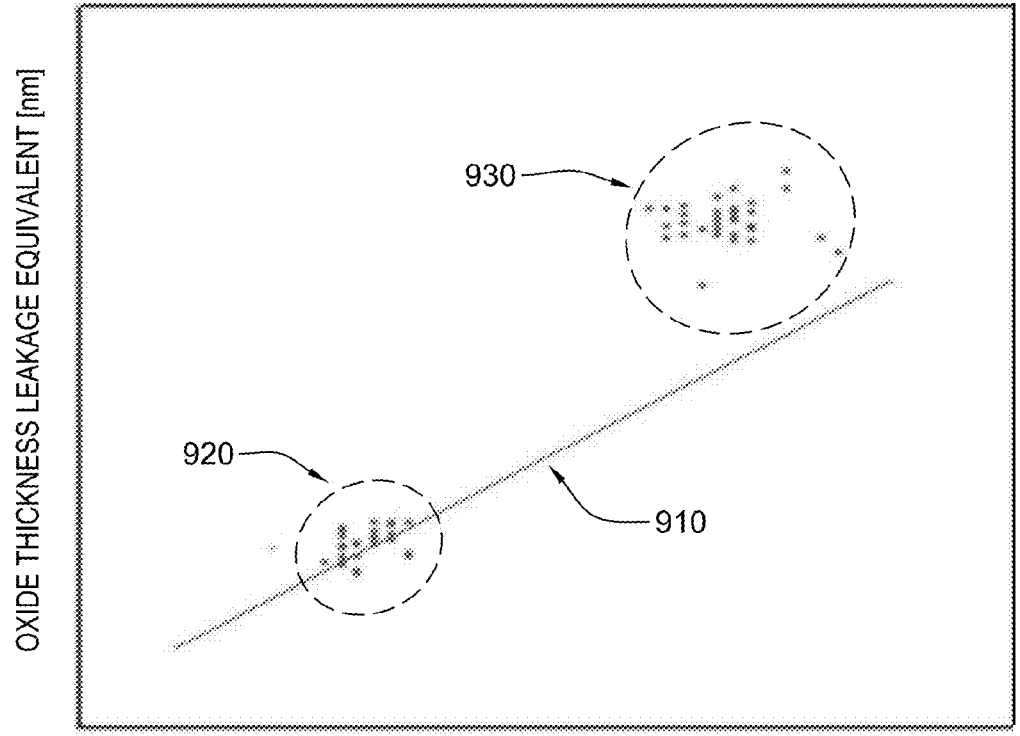
FIG. 9 is a graph of leakage of semiconductor gates fabricated by a conventional process and fabricated by a process in accordance with one or more aspects of the present invention.

Undesirable gate leakage of FETs fabricated in accordance with an aspect of the present invention is also beneficially reduced. FIG. 9 is a graph showing gate leakage of FETs manufactured in accordance with either a conventional fabrication process 920 or an aspect of the present invention 930. Inversion layer capacitance (F) is shown on the X axis. Current leakage for FET devices of various inversion layers capacitances was measured, and the amount of leakage was converted to a measure of what thickness of an oxide layer in a reference FET would be required to yield a FET with that gate leakage. This equivalent oxide thickness is shown on the Y axis. A higher equivalent oxide thickness for a FET at a given inversion layer thickness indicates less gate leakage. A best fit linear curve 910 of data plots of the equivalent oxide thickness of FETs manufactured in accordance with conventional fabrication processes 920 shows a projected equivalent oxide thickness across a range of inversion layer capacitances for such FETs. Data plots of the equivalent oxide thickness of FETs manufactured in accordance with an aspect of the present invention 930 are higher than projected equivalent oxide thicknesses at given inversion layer capacitances of FETs manufactured in accordance with a conventional fabrication process. In this example, depositing an etch stop layer 504 before depositing a dummy cap layer 505 resulted in a 10% improvement in gate leakage. A higher-than-projected equivalent oxide thickness of FETs manufactured in accordance with an aspect of the present invention indicates decreased undesirable gate leakage.

Figure 10:
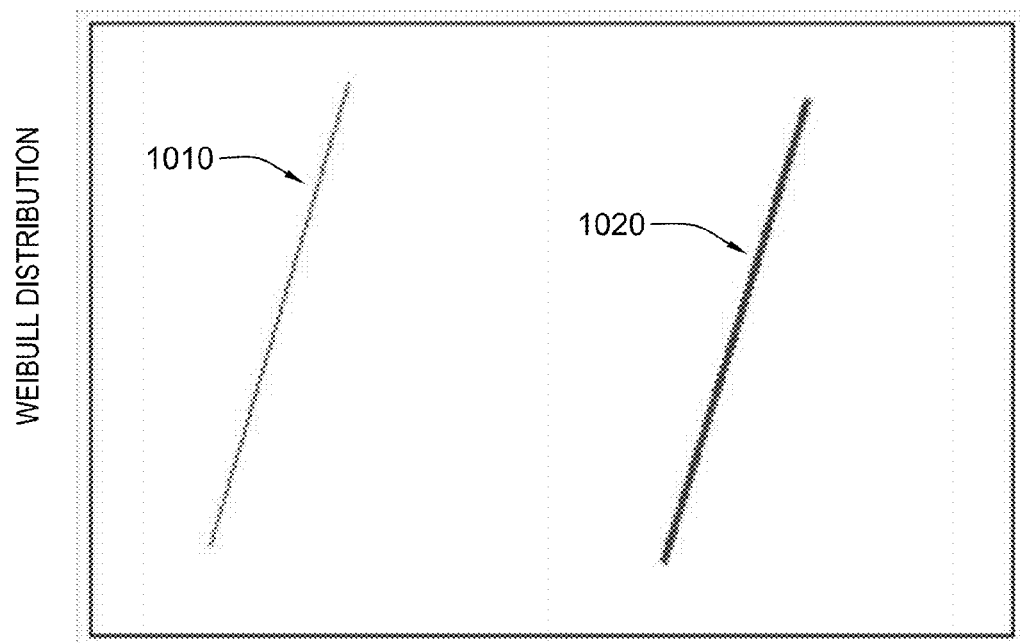
FIG. 10 is a graph of breakdown voltage of semiconductor gates fabricated by a conventional process and fabricated by a process in accordance with one or more aspects of the present invention.

Breakdown voltage of FETs fabricated in accordance with an aspect of the present invention is beneficially increased. FIG. 10 is a graph showing the Weibull distributions for breakdown voltages of FETs fabricated in accordance with conventional processes or an aspect of the present invention. The Y-axis is the probability of FET breakdown as expressed by cumulative Weibull distribution and the X-axis is breakdown voltage. The rightward shift in the distribution curve for FETs fabricated in accordance with an aspect of the present invention 1020 compared with those manufactured in accordance with a conventional fabrication process indicates a desirable increase in breakdown voltage. In this example, depositing an etch stop layer 504 before depositing a dummy cap layer 505 resulted in a 10% improvement in breakdown voltage.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. An embodiment was chosen and described in order to explain principles of one or more aspects of the invention and practical application, and to enable others of ordinary skill in the art to understand one or more aspects of the invention for various embodiments with various modifications as are suited to a particular use contemplated.

What is claimed is:

1. A method of manufacturing a semiconductor device comprising:
    depositing a dielectric layer on a substrate;
    depositing a first cap layer on the dielectric layer;
    depositing an etch stop layer on the first cap layer;
    depositing a dummy cap layer on the etch stop layer to form a partial gate structure, wherein the etch stop layer is between the first cap layer and the dummy cap layer;
    performing an annealing step after depositing the dummy cap layer; and
    after performing the annealing step, stripping at least part of the dummy cap layer, then depositing one or more additional layers.

2. The method of claim 1 wherein the dummy cap layer comprises a silicon-containing material.

3. The method of claim 1 wherein the etch stop layer comprises tantalum nitride.

4. The method of claim 1 wherein at least one of the one or more additional layers comprises a work-function layer.

5. The method of claim 1 wherein the dielectric layer comprises a material with a high dielectric constant.

6. The method of claim 5, wherein the material with a high dielectric constant comprises silicon dioxide, silicon nitride, silicon oxynitride, hafnium oxide, tantalum oxide, zirconium oxide, titanium oxide, aluminum oxide, or a combination thereof.

7. The method of claim 1 further comprising etching at least part of at least one of the one or more additional layers.

8. The method of claim 7 wherein etching comprises chemical etching.

9. The method of claim 1 wherein the first cap layer comprises titanium nitride.

10. The method of claim 9 wherein the etch stop layer comprises tantalum nitride.

11. The method of claim 10, further comprising stripping at least part of the dummy cap layer, then depositing one or more additional layers.

12. The method of claim 9 wherein the dummy cap layer comprises a silicon-containing material.

13. The method of claim 12 wherein the etch stop layer comprises tantalum nitride.

14. The method of claim 13, further comprising stripping at least part of the dummy cap layer, then depositing one or more additional layers.

15. A method of manufacturing a semiconductor device comprising:
    depositing on a substrate a dielectric layer;
    depositing a first cap layer comprising titanium nitride on the dielectric layer;
    depositing an etch stop layer comprising tantalum nitride on the first cap layer;
    depositing a dummy cap layer comprising a silicon-containing material on the etch stop layer, wherein the etch stop layer is between the first cap layer and the dummy cap layer;
    performing an annealing step after depositing the dummy cap layer;
    after performing the annealing step, stripping at least part of the dummy cap layer before depositing one or more additional layers; and
    etching at least part of at least one of the one or more additional layers wherein etching comprises chemical etching.

16. The method of claim 15, wherein the dielectric layer comprises silicon dioxide, silicon nitride, silicon oxynitride, hafnium oxide, tantalum oxide, zirconium oxide, titanium oxide, aluminum oxide, or a combination thereof.

* * * * *